United States Patent [19]
Aoai

[11] Patent Number: 5,254,432
[45] Date of Patent: Oct. 19, 1993

[54] PHOTOSENSITIVE COMPOSITION

[75] Inventor: Toshiaki Aoai, Shizuoka, Japan

[73] Assignee: Fuji Photo Film Co., Ltd., Minami-Ashigara, Japan

[21] Appl. No.: 514,941

[22] Filed: Apr. 26, 1990

[30] Foreign Application Priority Data

Apr. 28, 1989 [JP] Japan .................................. 1-110604

[51] Int. Cl.$^5$ .................... G03F 7/023; G03F 7/32; G03C 1/77
[52] U.S. Cl. .................................. 430/192; 430/165; 430/190; 430/191; 430/193; 430/278; 430/302; 430/326; 430/906; 522/97; 522/171; 528/51; 528/72; 528/85
[58] Field of Search ............... 430/192, 900, 191, 193, 430/165, 910, 278, 302; 522/62, 97, 171; 528/72, 51, 85

[56] References Cited

U.S. PATENT DOCUMENTS

| | | | |
|---|---|---|---|
| 3,607,289 | 9/1971 | Keberle et al. | 430/628 |
| 3,660,097 | 5/1972 | Mainthia et al. | 430/192 |
| 3,754,972 | 8/1973 | de Majistre et al. | 522/171 |
| 3,867,147 | 2/1975 | Teuscher | 430/175 |
| 3,867,351 | 2/1975 | Juna et al. | 522/171 |
| 4,289,838 | 9/1981 | Rowe et al. | 430/192 |
| 4,337,307 | 6/1982 | Neubauer et al. | 430/906 |
| 4,632,900 | 12/1986 | Demmer et al. | 430/193 |
| 4,647,475 | 3/1987 | Inukai et al. | 430/165 |
| 4,732,840 | 3/1988 | Hasegawa | 430/192 |
| 4,859,562 | 8/1989 | Pawlowski et al. | 430/906 |
| 4,877,711 | 10/1989 | Aoai et al. | 430/906 |
| 4,883,739 | 11/1989 | Sakaguchi et al. | 430/193 |
| 4,898,803 | 2/1990 | Aoai et al. | 430/192 |
| 4,946,757 | 8/1990 | Seio et al. | 430/192 |
| 4,950,582 | 8/1990 | Aoai et al. | 430/906 |
| 4,963,639 | 10/1990 | Sato et al. | 522/97 |
| 4,980,260 | 12/1990 | Shinozaki et al. | 430/192 |

Primary Examiner—Charles L. Bowers, Jr.
Assistant Examiner—John S. Chu
Attorney, Agent, or Firm—Burns, Doane, Swecker & Mathis

[57] ABSTRACT

The present invention relates to a photosensitive composition comprising an o-quinonediazide compound and a polyurethane resin having a phosphonic acid group, a phosphoric acid group or its ester group. The photosensitive composition of the present invention provides an excellent adhesion to the support, an excellent developability with an aqueous alkali developer, and a high printing durability.

16 Claims, No Drawings

PHOTOSENSITIVE COMPOSITION

BACKGROUND OF THE INVENTION

The present invention relates to a photosensitive composition suitable for use in making a lithographic plate, IC circuit or photomask. In particular, the present invention relates to a photosensitive composition comprising a positive working photosensitive compound and a polymeric compound having an excellent abrasion resistance.

Among positive working photosensitive compositions, a composition comprising an o-naphthoquinonediazide compound and a novolak-type phenolic resin is quite excellent and has been used in the preparation of a lithographic plate or as a photoresist on an industrial scale.

However, the use of this composition is still limited, because it has defects, due to the properties of novolak phenolic resin used as the main component, such as poor adhesion to the support, brittleness of the film, poor coating property, low abrasion resistance, and poor printing durability when it is used in the production of a lithographic plate.

To solve these defects, various polymeric compounds has been investigated as a binder. For example, polyhydroxystyrene or hydroxystyrene copolymers as described in Japanese Patent Publication for Opposition Purpose (hereinafter referred to as 'J. P. KOKOKU') No. 52-41050 provide improved film-forming properties. However, they are poor in respect of abrasion resistance. Further, it is proposed to use, as a binder, a polymeric compound having structural units of an acrylic acid derivative in the molecular structure in Japanese Patent Unexamined Published Application (hereinafter referred to as 'J. P. KOKAI') No. 51-34711. However, such a polymeric compound makes narrow the allowance of suitable developing conditions and provides an insufficient abrasion resistance.

Another known polymer having an excellent abrasion resistance is a polyurethane resin. A combination of a positive working diazo compound with a substantially linear polyurethane resin is described in U.S. Pat. NO. 3,660,097. However, this polyurethane resin has no alkali-soluble group essentially and therefore has an insufficient solubility in an aqueous alkali developer. It is thus quite difficult to conduct the development in such a manner that the photosensitive layer can be completely removed from the non-image area (exposed area).

A photosensitive composition comprising an anionic polyurethane resin is described in J. P. KOKAI NO. 61-20939. This anionic polyurethane resin is water-soluble and, therefore, is essentially different from the water-insoluble polyurethane resin of the present invention and has an insufficient solubility in coating organic solvent. Another defect of the anionic polyurethane resin is to deteriorate the stability of the diazo compounds.

A positive working photosensitive composition comprising a polyurethane resin having a carboxyl group is described in U.S. Pat. No. 4,898,803 and a photosensitive composition comprising a polyurethane resin having an acidic hydrogen such as N-sulfonylamido or N-sulfonylurethane group is described in J. P. KOKAI No. 63-261350. Although they are soluble in the aqueous alkali developer and have an excellent abrasion resistance, the adhesion thereof to an aluminum support is not always sufficient. Therefore, the photosensitive layer is sometimes peeled off from the support depending on the storage conditions.

SUMMARY OF THE INVENTION

Therefore, the object of the present invention is to provide a new photosensitive composition having an excellent adhesion to the support, excellent developability with an aqueous alkali developer and high printing durability.

After intensive investigations made for the purpose of attaining the above-described object, the inventors have found out that the object can be attained by a new photosensitive composition comprising an o-quinonediazide compound and a polyurethane resin having a phosphonic acid group, a phosphoric acid group or an ester group thereof. The present invention has been completed on the basis of this finding.

DETAILED EXPLANATION OF THE INVENTION

The positive working o-quinonediazide compound usable in the present invention is preferably o-naphthoquinonediazide compounds.

The o-naphthoquinonediazide compounds usable in the present invention can be generally represented as sulfonic acid ester compounds prepared by a chemical condensation of a 1,2-naphthoquinone-2-diazide compound having a halogenosulfonyl group such as a sulfonyl chloride group at its 4- or 5-position, with a mono- or polyhydroxyphenyl compound. Typical examples of the mono- or polyhydroxyphenyl compounds are benzophenone compounds having a hydroxyl group such as 4-hydroxybenzophenone, 2,4-dihydroxybenzophenone, 2,2'-dihydroxybenzophenone, 4,4'-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,3,4,2'-tetrahydroxybenzophenone, 3,3',4,4'-tetrahydroxybenzophenone, benzophenone compounds having 5 or more hydroxyl groups as described in J. P. KOKAI No. 62-150245 and their derivatives. They also include p-cresol, p-t-butylphenol, resorcin, pyrogallol and hydroxy-substituted biphenyl compounds such as 2,2'-dihydroxybiphenyl and 2,2',4,4'-tetrahydroxybiphenyl.

Compounds having a relatively high molecular weight such as a phenol/formaldehyde resin and o-, m- or p-cresol/formaldehyde resin as described in U.S. Pat. No. 3,046,120 are also usable in the present invention.

Those effectively usable in the present invention further include condensates of a polyhydric phenol with an aldehyde or a ketone as described in U.S. Pat. Nos. 4,306,010, 4,306,011 and 3,635,709 and J. P. KOKOKU No. 49-24361; co-condensate of catechol, resorcin or hydroquinone with a substituted phenol produced in the presence of an aldehyde or ketone, as described in J. P. KOKAI Nos. 59-84238 and 59-84239; condensates of a substituted phenol with benzaldehyde as described in J.P. KOKAI No. 60-31138; as well as co-condensates of phenol with a substituted phenol such as o-, m- or p-cresol produced in the presence of an aldehyde or a ketone; and p-hydroxystyrene polymers.

The 1,2-naphthoquinone-2-diazido-4- and/or 5-sulfonic ester compounds of the present invention can be prepared by reacting one or more mono- or polyhydroxyphenyl compounds with 1,2-naphthoquinone-2- diazido-4- and/or 5-sulfonyl halide in the presence of a basic catalyst in a reaction medium. The amount of the 1,2-naphthoquinone-2-diazido-4- and/or 5-sulfonyl halide is not particularly limited but is suitably determined depending on the number of the hydroxyl groups of the hydroxyphenyl compound. It is usually 0.1 to 1 mol per equivalent of the hydroxyl group.

The basic catalysts usable herein include amines such as trimethylamine, triethylamine, tripropylamine, pyridine and tetramethylammonium hydroxide; and inorganic alkalis such as sodium hydroxide, potassium hydroxide and sodium carbonate.

The amount of the basic catalyst used is usually 0.8 to 2.0 mol, preferably 1.0 to 1.5 mol, per mol of the 1,2-naphthoquinone-2-diazide.

The reaction media usually used in the present invention include, for example, ketones such as acetone, methyl ethyl ketone and methyl isobutyl ketone; cyclic ethers such as dioxane and tetrahydrofuran; cyclic ketones such as cyclopentanone and cyclohexanone; amides such as N,N-dimethylformamide and N,N-dimethylacetamide; esters such as γ-butyrolacetone, ethylene carbonate and propylene carbonate; pyrrolidone and N-methylpyrrolidone; and water. The amount of the reaction medium used is usually 100 to 1,000 parts by weight for 100 parts by weight of the hydroxyphenyl compound. The reaction temperature ranges usually from $-30°$ C. to 60° C., and is preferably 40° C.

The amount of the 1,2-naphthoquinone-2-diazide compound used is 5 to 70% by weight, preferably 10 to 50% by weight, based on the whole solid content of the photosensitive composition.

If necessary, a combination of two or more 1,2-naphthoquinone-2-diazide compounds can be used.

The polyurethane resin preferably used in the present invention is those having a phosphonic acid group, a phosphoric acid group or its ester group mainly in the main chain. If necessary, the polyurethane resin may further contain a carboxyl group.

Preferred polyurethane resins include those comprising, as a basic structure, a reaction product of a diisocyanate compound of the following general formula (I) with a diol compound having a phosphonic acid group, a phosphoric acid group or its alkyl or aryl ester group of the following general formula (II), (III) or (IV):

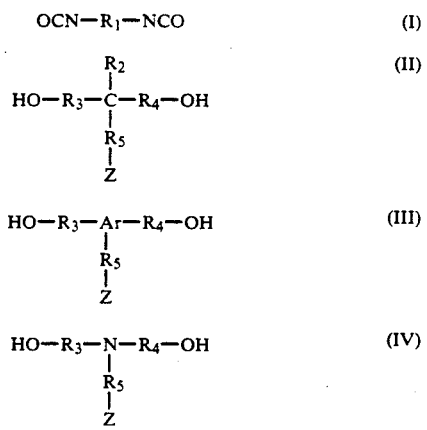

wherein $R_1$ represents a divalent aliphatic or aromatic hydrocarbon group unsubstituted or substituted with a substituent (preferably an alkyl, aralkyl, aryl, alkoxy or halogen group) and, if necessary, $R_1$ may have another functional group inert to the isocyanate group such as an ester, urethane, amido or ureido group, $R_2$ represents a hydrogen atom or an alkyl, aralkyl, aryl, alkoxy or aryloxy group which may be either unsubstituted or substituted with, for example, a cyano or nitro group, a halogen atom (—R, —Cl, —Br or —I), —CONH$_2$, —COOR$_6$, —OR$_6$, —NHCONHR$_6$, —NHCOOR$_6$, —NHCOR$_6$, —OCONHR$_6$, or —CONHR$_6$, R$_6$ being an alkyl group having 1 to 10 carbon atoms or an aralkyl group having 7 to 15 carbon atoms; preferably $R_2$ is a hydrogen atom, an alkyl group having 1 to 8 carbon atoms or an aryl group having 6 to 15 carbon atoms, $R_3$, $R_4$ and $R_5$ may be the same as or different from one another and each represents a single bond or a divalent aliphatic or aromatic hydrocarbon group which may be either unsubstituted or substituted with a substituent such as preferably an alkyl, aralkyl, aryl or alkoxy group or with a halogen atom; they are preferably an alkylene group having 1 to 20 carbon atoms or an arylene group having 6 to 15 carbon atoms, and more preferably an alkylene group having 1 to 8 carbon atoms; if necessary, $R_3$, $R_4$ and $R_5$ may contain a functional group which is inert to the isocyanate group such as a carbonyl, ester, urethane, amido, ureido or ether group; and two or three of $R_2$, $R_3$, $R_4$ and $R_5$ may be joined together to form a ring, Ar represents a trivalent aromatic hydrocarbon group which may be either unsubstituted or substituted; and Ar is preferably an aromatic hydrocarbon group having 6 to 15 carbon atoms; and Z represents

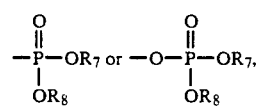

wherein $R_7$ and $R_8$ are either the same as or different from one another and each represents a hydrogen, sodium or potassium atom or an alkyl or aryl group; preferably $R_7$ and $R_8$ each represents a hydrogen atom, an alkyl group having 1 to 8 carbon atoms, or an aryl group having 6 to 15 carbon atoms.

The diisocyanate compounds of the general formula (I) include, for example, aromatic diisocyanate compounds such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanates such as hexamethylene diisocyanate, trimethylhexamethylene diisocyanate, lysine diisocyanate and dimer acid diisocyanates; alicyclic diisocyanate compounds such as isophorone diisocyanate, 4,4'-methylenebis(cyclohexyl isocyanate), methylcyclohexane-2,4-(or 2,6-) diisocyanate and 1,3-(isocyanatomethyl)cyclohexane; and diisocyanate compounds obtained by reacting a diol with a diisocyanate such as an adduct of 1 mol of 1,3-butylene glycol and 2 mol of tolylene diisocyanate.

The diol compounds having a phosphonic acid group, a phosphoric acid group or its ester group as represented by the general formulae (II), (III) and (IV) are produced by, for example, processes which will be described below.

In one of the processes, a hydroxyl group of a halogen compound represented by the following general formula (V), (VI) or (VII) is protected, if necessary, then the compound is converted into its phosphonate ester by Michaelis-Arbuzov reaction represented by the following formula (VIII) and, if necessary, the resulting ester is hydrolyzed with hydrogen bromide or the like.

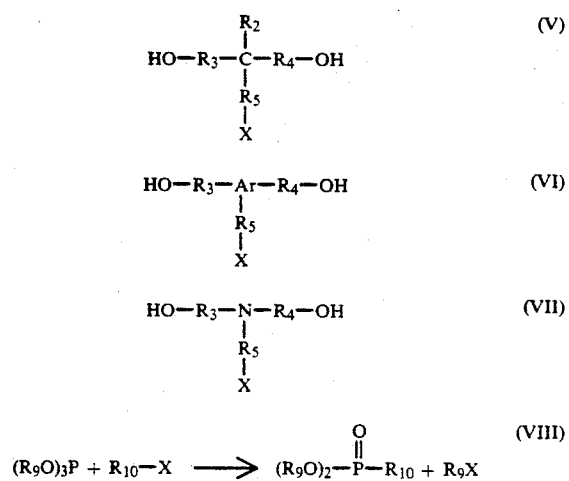

wherein $R_2$, $R_3$, $R_4$, $R_5$ and Ar are as defined in the above formula (II), (III) or (IV), $R_9$ represents an alkyl group or aryl group, preferably an alkyl group having 1 to 8 carbon atoms or aryl group having 6 to 15 carbon atoms, $R_{10}$ represents a group formed by eliminating X from the formula (V), (VI) or (VII), X represents a halogen atom, preferably Cl, Br or I.

Another process for producing the diol compounds comprises reacting a compound of the formula: $R_{10}$—OH with phosphorus oxychloride and hydrolyzing the reaction product as shown by the following formula (IX):

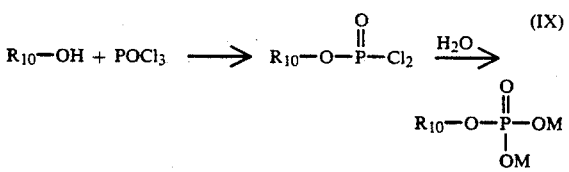

wherein $R_{10}$ is as defined in the formula (VIII) and M represents a hydrogen, sodium or potassium atom.

The polyurethane resin having a phosphonic acid group can be produced by reacting a diisocyanate compound of the general formula (I) with a diol compound having a phosphonic acid ester group of the general formula (II), (III) or (IV) to form a polyurethane resin and then hydrolyzing it with hydrogen bromide or the like.

The carboxyl group can be introduced, if necessary, into the polyurethane resin of the present invention by, for example, using a diol compound having a carboxyl group as represented by the following general formula (X), (XI) or (XII) in combination with a diol compound of the above general formula (II), (III) or (IV):

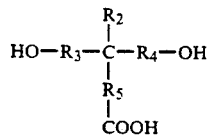

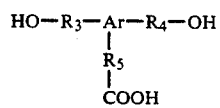

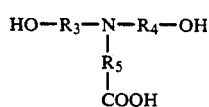

wherein $R_2$, $R_3$, $R_4$, $R_5$ and Ar are as defined in the general formula (II), (III) or (IV).

The diol compounds having a carboxyl group and represented by the general formula (X), (XI) or (XII) include, for example, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid, N,N-dihydroxy-ethylglycine and N,N-bis(2-hydroxyethyl)-3-carboxypropionamide.

The polyurethane resin of the present invention can be produced from a diisocyanate compound of the general formula (I), two or more of the diol compounds of the general formulae (II), (III) and (IV) and two or more of the diol compounds of the general formulae (X), (XI) and (XII).

A diol compound different from those of the above general formulae (II), (III), (IV), (X), (XI) and (XII) can be used in combination of the above-described diol compounds so far as the alkali developability is not impaired.

Such diol compounds include, for example, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,4-butanediol, 1,5-pentanediol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, bisphenol A/ethylene oxide adduct, bisphenol A/propylene oxide adduct, bisphenol F/ethylene oxide adduct, bisphenol F/propylene oxide adduct, hydrogenated bisphenol A/ethylene oxide adduct, hydrogenated bisphenol A/propylene oxide adduct, hydroquinone dihydroxyethyl ether, p-xylylene glycol, dihydroxyethylsulfone, bis(2-hydroxyethyl)-2,4-tolylene dicarbamate, 2,4-tolylene-bis-(2-hydroxyethylcarbamide) and bis(2-hydroxyethyl)-m-xylylene dicarbamate.

The polyurethane resin of the present invention is produced by heating the above-described diisocyanate compound and diol compound in the presence of a known active catalyst selected suitably for the reactivity of the reactants in an aprotic solvent. The molar ratio of the diisocyanate to the diol compound used is preferably 0.8:1 to 1.2:1. When an isocyanate group is present at an end of the polymer, it is treated with an alcohol or amine to obtain the final product free from the isocyanate group.

The weight-average molecular weight of the polyurethane resin of the present invention is preferably at least 1,000, more preferably in the range of 5,000 to 200,000.

The polyurethane resins may be used either singly or in the form of a mixture of them. The polyurethane resin content of the photosensitive composition is about 30 to 95% by weight, preferably about 50 to 90% by weight.

The composition of the present invention may contain a known alkali-soluble polymeric compound such as a phenol/formaldehyde resin, cresol/formaldehyde resin, phenol-modified xylene resin, polyhydroxystyrene or polyhalogenated hydroxystyrene, together with the present polyurethane resin. The alkali-soluble polymeric compound is used in an amount of at most 70% by weight based on the total composition.

The composition of the present invention may contain a cyclic acid anhydride for improving the sensitivity, an agent for obtaining a visible image immediately after exposure, a dye for coloring the image and a filler. The cyclic acid anhydrides include phthalic anhydride, tetrahydrophthalic anhydride, hexahydrophthalic anhydride, 3,6-endoxy- $\Delta^4$-tetrahydrophthalic anhydride, tetrachlorophthalic anhydride, maleic anhydride, chloromaleic anhydride, $\alpha$-phenylmaleic anhydride, succinic anhydride and pyromellitic acid as described in U.S. Pat. No. 4,115,128. When 1 to 15% by weight, based on the whole composition, of the cyclic acid anhydride is incorporated thereinto, the sensitivity of the composition can be increased to at most three times higher. A typical example of the agents for obtaining a visible image immediately after exposure is an organic dye capable of forming a salt with a photosensitive composition capable of releasing an acid upon exposure. In particular, they include a combination of a salt-forming organic dye with an o-naphthoquinone diazide-4-sulfonic acid halide as described in U.S. Pat. No. 3,969,118 and J. P. KOKAI No. 53-8128 and a combination of a trihalomethyl compound with a salt-forming organic dye as described in U.S. Pat. Nos. 4,160,671 and 4,232,106. The colorants for the image include also dyes other than the above-described salt-forming organic dyes. Examples of the preferred dyes including also the salt-forming organic dyes are oil-soluble dyes and basic dyes such as Oil Yellow #101, Oil Yellow #130, Oil Pink #312, Oil Green BG, Oil Blue BOS, Oil #603, Oil Black BY, Oil Black BS and Oil Black T-505 (which are products of Orient Kagaku Kogyo Co., Ltd.), Victoria Pure Blue, Crystal Violet (CI 42555), Methyl Violet (CI 42535), Rhodamine B (CI 145170B), Malachite Green (CI 42000) and Methylene Blue (CI 52015) and more preferably those dyes described in Great Britain Patent No. 2192729.

The composition of the present invention is dissolved in a solvent in which the above ingredients are soluble, and the solution is applied to a support. The solvents usable herein include, for example, methanol, ethanol, isopropanol, n-butanol, t-butanol, ethylene dichloride, cyclohexanone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, methyl lactate, ethyl lactate, N,N-dimethylformamide, N,N-dimethylacetamide, $\gamma$-butyrolactone, N-methylpyrrolidone, tetramethylurea, tetrahydrofuran, dioxane, dimethyl sulfoxide, sulfolane, toluene and ethyl acetate. These solvents are used either singly or in the form of a mixture of them. The concentration (solid content) of the solution is 2 to 50% by weight. The amount of the solution to be applied to the support varies depending on the use. For example, in the production of a photosensitive lithographic plate, the amount of the coating is usually and preferably 0.5 to 3.0 g/m$^2$ (in terms of the solid). As the amount of the coating is reduced, photosensitivity is increased, but the properties of the photosensitive film are impaired.

In order to improve coatability and uniformity of the photosensitive layer, a surfactant such as a fluorine-containing surfactant disclosed in U.S. Pat. Nos. 3,787,351, 4,487,823, 4,504,567 and 4,822,713 may be added to the composition of the invention.

The amount of the surfactant to be added is preferably from 0.01 to 1% by weight, more preferably from 0.05 to 0.5% by weight based on the total weight of the photosensitive composition.

The support includes, for example, papers; papers laminated with a plastiac (such as polyethylene, polypropylene or polystyrene); metal sheets such as aluminum (including also aluminum alloys), zinc and copper sheets; plastic films such as cellulose diacetate, cellulose triacetate, cellulose propionate, cellulose butyrate, celulose acetate butyrate, cellulose nitrate, polyethylene terephthalate, polyethylene, polystyrene, polypropylene, polycarbonate and polyvinyl acetal; and papers and plastaic films having a coating film of the above-described metal formed by lamination or vacuum deposition. Among these supports, an aluminum sheet is particularly preferred, because it has a quite high dimensional stability and is inexpensive. Further, a composite film comprising a polyethylene terephthalate film having an aluminum sheet bonded therewith as described in British Patent No. 1,329,714 is also preferred.

When the support has a metallic surface, particularly a aluminum surface, it is preferably surface-treated by graining, by immersion in an aqueous solution of sodium silicate, potassium fluorozirconate or a phosphoric acid or by anodic oxidation. Further, those which are also preferably usable are an aluminum plate immersed in an aqueous sodium silicate solution as described in U.S. Pat. No. 2,714,066, an aluminum plate anodically oxidized and then immersed in an aqueous alkali metal silicate solution as described in U.S. Pat. No. 3,181,461 and an aluminum support processed by a combination of a mechanical surface roughening with electrolytic surface roughening, as described in U.S. Pat. No. 4,476,006. The anodic oxidation is conducted by applying an electric current by using the aluminum plate as an anode in an electrolytic solution comprising an aqueous or nonaqueous solution of an inorganic acid such as phosphoric acid, chromic acid, sulfuric acid or boric acid or an organic acid such as oxalic acid or sulfamic acid or a salt thereof. These solutions can be used either singly or in combination of two or more of them.

The support which has been subjected to a sealing process after the graining or anodic oxidation is also preferred. The sealing is conducted by immersing the support in an aqueous sodium silicate solution, hot water or hot aqueous solution of an inorganic or organic salt, or by means of a steam bath.

Further, the electrodeposition with a silicate as described in U.S. Pat. No. 3,658,662 is also effective.

Suitable developers for the photosensitive composition of the present invention are aqueous solutions of an inorganic alkali such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia. It is used in such an amount that the concentration thereof would be 0.1 10% by weight, preferably 0.5 to 5% by weight.

If necessary, a surfactant and an organic solvent such as an alcohol can be added to the aqueous alkali solution.

The photosensitive composition of the present invention thus applied to the support is exposed through a transparent original image such as a linear image or halftone dot image, and then developed with an aqueous alkali developer to obtain a positive relief image.

The light sources usable for the exposure include, for example, a carbon arc lamp, mercury lamp, xenone lamp, tungsten lamp and metal halide lamp.

The photosensitive composition of the present invention exhibits an excellent coating properties when it is applied to the support. After the coating followed by drying and imagewise exposure, it exhibits an excellent developability when the exposed area is developed with the aqueous alkali developer. The relief thus obtained has an excellent adhesion to the support and when it is used as a printing plate, a great number of prints can be obtained.

The following Synthetic Examples and Examples will further illustrate the present invention, which by no means limit the scope of the present invention.

SYNTHETIC EXAMPLE 1

27.9 g (0.140 mol) of N,N-bis(2-hydroxyethyl)aminomethylphosphonic acid of the formula:

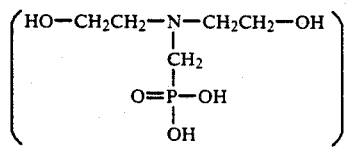

and 6.4 g (0.060 mol) of diethylene glycol were dissolved in 100 g of N,N-dimethylacetamide in a 500 ml three-necked round-bottom flask provided with a condenser and a stirrer. 31.6 g (0.126 mol) of 4,4'-diphenylmethane diisocyanate and 14.1 g (0.084 mol) of hexamethylene diisocyanate were added thereto and then 0.1 g of dibutyltin dilaurate (catalyst) was added thereto. They were stirred under heating at 100° C. for 6 h. Then the reaction product was diluted with 100 ml of N,N-dimethylformamide and 150 ml of methanol. The reaction product was added to 6 l of water under stirring to precipitate a white polymer. It was taken by filtration, washed with water and dried in vacuo to give 74 g of the polymer.

The molecular weight of the polymer was determined according to gel permeation chromatography (GPC) to reveal that the weight average molecular weight was 19,000 (standard: polystyrene). The acid value (phosphonic acid group content) of the product determined by titration was 1.79 meq/g [Polyurethane resin (a) of the present invention].

SYNTHETIC EXAMPLE 2

25.5 g (0.100 mol) of diethyl N,N-bis(2-hydroxyethyl)aminomethylphosphophonate of the following formula:

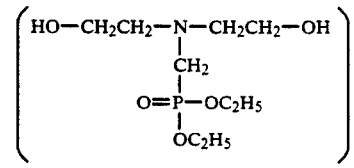

and 13.4 g (0.100 mol) of 2,2-bis(hydroxymethyl)propionic acid were dissolved in 120 g of N,N-dimethylacetamide in a 500 ml three-necked round-bottom flask provided with a condenser and a stirrer. 31.6 g (0.126 mol) of 4,4'-diphenylmethane diisocyanate and 18.7 g (0.084 mol) of isophorone diisocyanate were added to the solution, and then 0.1 g of dibutyltin dilaurate (catalyst) was added thereto. They were stirred under heating at 100° C. for 4 h. Then the same procedure as that of Synthetic Example 1 was repeated to give 84 g of a white polymer.

The molecular weight of the polymer was determined according to GPC (standard: polystyrene) to reveal that the weight average molecular weight was 45,000. The acid value (carboxyl group content) of the product determined by titration was 1.13 meq/g [Polyurethane resin (b) of the present invention].

SYNTHETIC EXAMPLE 3

20 g of the Polyurethane resin (b) of the present invention produced in Synthetic Example 2 was dissolved in 200 ml of N,N-dimethylacetamide/acetic acid (1:1). 15.9 g (0.092 mol) of a 47% aqueous hydrogen bromide solution was added thereto and the mixture was stirred under heating at 80° C. for 2 h. The reaction product was added to 4 l of water under stirring, to precipitate a white polymer. The polymer was taken by filtration, washed with water and dried in vacuo to give 17 g of the polymer.

It was confirmed by NMR method that diethyl phosphonate had been hydrolyzed into phosphonic acid. The acid value (phosphonic acid group and carboxyl group content) of the product determined by titration was 2.19 meq/g. The conversion into phosphonic acid calculated from the acid value was about 80% [Polyurethane resin (c) of the present invention].

SYNTHETIC EXAMPLES 4 TO 16

Polyurethane resins of the present invention were produced from a diisocyanate compound and a diol compound shown in Table 1 below in the same manner as that of Synthetic Example 1, 2 or 3.

The molecular weight of the product was determined according to GPC and the acid value was determined by titration. The acid values are also shown in Table 1. The weight average molecular weights of the products ranged from 18,000 to 55,000 (standard: polystyrene).

TABLE 1

| Polyurethane resin | Diisocyanate compound used (molar %) | Diol compound having a phosphonic acid group, a phosphoric acid group or its ester group (molar %) | Another diol compound used (molar %) | Acid value (meq/g) |
|---|---|---|---|---|
| (d) | OCN—H₂C—⌬—CH₂—NHCO (100) | HO—CH₂CH₂—N—CH₂CH₂—OH                                        CH₂                                    O=P—OH                                       OH + HO—CH₂CH₂—N—CH₂CH₂—OH with CH₂—P(=O)(OC₂H₅)₂ (40) | HO—CH₂—C(CH₃)(COOH)—CH₂—OH (60) | 2.52 |
| (e) | OCN—⌬—CH₂—⌬—NCO (60) + OCN—H₂C—⌬—CH₂—NCO (40) | HO—CH₂CH₂—N—CH₂CH₂—OH / O=P—OH(OH) + HO—CH₂CH₂—N—CH₂CH₂—OH / CH₂P(=O)(OC₂H₅)₂ (40) | HO—CH₂—C(CH₃)(COOH)—CH₂—OH (60) | 2.31 |
| (f) | H₃C—⌬—⌬—CH₃ with OCN, NCO (100) | HO—CH₂CH₂—N—CH₂CH₂—OH / O=P—OH(OH) + HO—CH₂CH₂—N—CH₂CH₂—OH / CH₂P(=O)(OC₂H₅)₂ (30) | HO—CH₂—C(CH₃)(COOH)—CH₂—OH (70) | 2.18 |
| (g) | naphthalene-1,5-diisocyanate (100) | HO—CH₂CH₂—N—CH₂CH₂—OH / O=P—OH(OH) (50) | HO—CH₂CH₂—N(C=O)—CH₂CH₂—OH with CH₂CH₂—COOH (50) | 1.99 |
| (h) | tolylene diisocyanate dimer (50) + OCN—(CH₂)₆—NCO (50) | HO—CH₂CHCH₂—OH / O=P—OH(OH) + HO—CH₂CHCH₂—OH / O=P(OC₂H₅)(OC₂H₅) (40) | HO—CH₂—C(CH₃)(COOH)—CH₂—OH (40) + HO—(CH₂CH₂—O)₂₀—H (20) | 1.80 |

TABLE 1-continued
| Polyurethane resin | Diisocyanate compound used (molar %) | Diol compound having a phosphonic acid group, a phosphoric acid group or its ester group (molar %) | Another diol compound used (molar %) | Acid value (meq/g) |
|---|---|---|---|---|
| (i) |  |  |  | 2.10 |
| (j) |  |  |  | 2.15 |
| (k) |  |  | | 2.20 |
| (l) |  | | | 2.33 |

TABLE 1-continued

| Polyurethane resin | Diisocyanate compound used (molar %) | Diol compound having a phosphonic acid group, a phosphoric acid group or its ester group (molar %) | Another diol compound used (molar %) | Acid value (meq/g) |
|---|---|---|---|---|
| (m) | OCN—C₆H₄—CH₂—C₆H₄—NCO (70) + OCN—(CH₂)₆—NCO (30) | HO—CH₂CHCH₂—OH<br>            \|<br>            O<br>            \|<br>    O=P—OH<br>        \|<br>        OH (30) | HO—CH₂—C(CH₃)(COOH)—CH₂—OH (60) + HO—(CH₂CH₂—O)₇—H (10) | 2.41 |
| (n) | OCN—C₆H₄—CH₂—C₆H₄—NCO (70) + isophorone diisocyanate (30) | HO—CH₂CHCH₂—OH<br>            \|<br>            O<br>            \|<br>    O=P—OH<br>        \|<br>        OH (40) | HO—CH₂—C(CH₃)(COOH)—CH₂—OH (60) | 2.52 |
| (o) | 1,5-naphthalene diisocyanate (60) + OCN—(CH₂)₆—NCO (40) | HO—CH₂CH—OH<br>         \|<br>        CH₂<br>        \|<br>        O<br>        \|<br>    O=P—OH<br>        \|<br>        OH (40) | HO—CH₂—C(CH₃)(COOH)—CH₂—OH (40) + HO—(CH₂CH₂—O)₇—H (20) | 2.38 |
| (p) | OCN—C₆H₄—CH₂—C₆H₄—NCO (60) + OCN—(CH₂)₆—NCO (40) | HO—CH₂CH₂—N(CH₂CH₂—OH)—CH₂—P(=O)(OH)₂ + HO—CH₂CH₂—N(CH₂CH₂—OH)—CH₂—P(=O)(OC₂H₅)₂ (60) | HO—(CH₂CH₂—O)₇—H (40) | 1.82 |

The polyurethane resins (d), (e), (f), (h), (i), (j), (l) and (p) of the present invention shown in Table 1 were produced by the process of Synthetic Example 2 or 3 and the remaining resins were produced by the process of Synthetic Example 1.

EXAMPLES 1 TO 9

The surface of an aluminum sheet having a thickness of 0.30 μm was grained with a nylon brush and an aqueous suspension of a pumice powder having a size of 400 mesh and then thoroughly washed with water. The sheet was etched by immersion in a 10% sodium hydroxide solution at 70° C. for 60 sec, washed with running water, neutralized with 20% $HNO_3$ and washed with water. The surface was roughened by electrolysis in a 1% aqueous nitric acid solution using alternating sinusoidal current under conditions comprising $V_A$ of 12.7 V and the quantity of electricity at the anode time of 160 coulombs/$dm^2$. The surface roughness of the sheet was 0.6 μm (Ra). The plate was then immersed in a 30% aqueous $H_2SO_4$ solution and desmutted at 55° C. for 2 min and then subjected to anodic oxidation in a 20% aqueous $H_2SO_4$ solution at a current density of 2 A/$dm^2$ to give a thickness of 2.7 g/$m^2$.

Nine varieties of the photosensitive compositions [A]-1 to [A]-9 were prepared by using various polyurethane resins listed in Table 2 below in the following photosensitive composition [A]. Each of the photosensitive compositions was applied to the resultant aluminum sheet and dried at 100° C. for 2 min to produce photosensitive lithographic plates [A]-1 to [A]-9. The amount of the composition thus applied was 2.5 g/$m^2$ (on dry basis).

The polyurethane resins of the present invention used for the production of the photosensitive compositions [A]-1 to [A]-9 are shown in Table 2.

Photosensitive Composition [A]

| | |
|---|---|
| Esterification product from naphthoquinone-1,2-diazido-5-sulfonyl chloride and pyrogallol/acetone resin (described in Example 1 of U.S. Pat. No. 3,635,709) | 0.45 g |
| Polyurethane resin of the present invention (Table 2) | 0.40 g |
| Cresol/formaldehyde novolak resin | 0.70 g |
| 2-(p-Methoxyphenyl)-4,6-bis(trichloromethyl)-S-triazine | 0.02 g |
| Oil Blue #603 (mfd. by Orient Kagaku Kogyo Co., Ltd.) | 0.01 g |
| Ethylene dichloride | 10 g |
| Methyl cellosolve | 10 g |

For comparison, a photosensitive composition [B] containing the following polymer in place of the polyurethane resin of the present invention was applied to the support and dried in the same manner as that described above. The dry weight thereof was 2.5 g/$m^2$.

(Polymer Used in Comparative Example)

A polyurethane resin produced by the following formula:

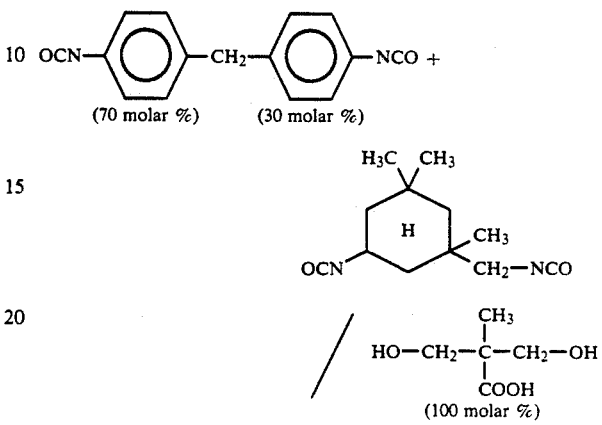

This polyurethane resin has an acid value of 2.52 meq/g and weight average molecular weight (standard: polystyrene) of 35,000 [Polymer in Table 1 (l) of U.S. Pat. No. 4,898,803].

Photosensitive lithographic plates [A]-1 to [A]-9 and [B] produced from the photosensitive compositions [A]-1 to [A]-9 and [B], respectively, were immersed in warm water at 40° C. for 60 min. Then, the surface of the photosensitive layer of each plate was dried and a commercially available adhesive tape (Nitto Tape) was applied thereto. The tape was peeled off and the degree of peeling of the photosensitive layer from the aluminum support was examined. The results are shown in Table 2.

TABLE 2

| Photosensitive lithographic plate | Polymer used | Peeling of photosensitive layer |
|---|---|---|
| [A]-1 Example 1 | Polyurethane resin (a) of the present invention | Not peeled |
| [A]-2 Example 2 | Polyurethene resin (c) of the present invention | " |
| [A]-3 Example 3 | Polyurethane resin (e) of the present invention | " |
| [A]-4 Example 4 | Polyurethane resin (f) of the present invention | " |
| [A]-5 Example 5 | Polyurethane resin (i) of the present invention | " |
| [A]-6 Example 6 | Polyurethane resin (j) of the present invention | " |
| [A]-7 Example 7 | Polyurethane resin (l) of the present invention | " |
| [A]-8 Example 8 | Polyurethane resin (m) of the present invention | " |
| [A]-9 Example 9 | Polyurethane resin (p) of the present invention | " |
| [B] Comparative Example | Polymer in comparative Example | Partially peeled |

It is apparent from Table 2 that the photosensitive layer was not peeled off from the Photosensitive lithographic plates [A]-1 to [A]-9 containing the polyurethane resin of the present invention and the adhesion of the photosensitive layer to the support was quite excellent unlike that of Photosensitive lithographic plate [B] in the Comparative Example.

EXAMPLES 10 TO 17

Examples 1 to 8 were repeated to produce photosensitive lithographic plates [A]-1 to [A]-8 shown in the following Table 3.

For comparison, the following Photosensitive composition [C] was applied to the support in the same manner as Photosensitive composition [A] to produce Photosensitive lithographic plate [C]. The amount of the coating film after drying was 2.5 g/m².

Photosensitive Composition [C]

| | |
|---|---|
| Esterification product from naphthoquinone-1,2-diazido-5-sulfonyl chloride and pyrogallol/acetone resin (described in Example 1 of U.S. Pat. No. 3,635,709) | 0.45 g |
| Cresol-formaldehyde novolak resin | 1.10 g |
| 2-(p-methoxyphenyl)-4,6-bis(trichloromethyl)-S-triazine | 0.02 g |
| Oil Blue #603 (mfd. by Orient Kagaku Kogyo Co., Ltd.) | 0.01 g |
| Ethylene dichloride | 10 g |
| Methyl cellosolve | 10 g |

A positive transparent original was closely placed on each of Photosensitive lithographic plates [A]-1 to [A]-8 and [C] produced in Examples 10 to 17 and then imagewise exposed to light of PS Light (a product of Fuji Photo Film Co., Ltd.) at a distance of 1 m for 1 min.

The exposed Photosensitive lithographic plates [A]-1 to [A]-8 and [C] were immersed in a 8-fold dilute aqueous solution of DP-4 (trade name of Fuji Photo Film Co., Ltd.) at 25° C. for 60 sec to conduct the development.

The resulting Lithographic plates [A]-1 to [A]-8 and [C] were used for producing prints by using wood free papers with a commercially available ink by means of KOR printing machine of Heidelberg Co. The numbers of the prints produced with the Lithographic plates [A]-1 to [A]-8 and [C] were as shown in Table 3.

TABLE 3

| Photosensitive lithographic plate | Polymer used | Number of prints produced |
|---|---|---|
| [A]-1 Example 10 | Polyurethane resin (a) of the present invention | 60,000 |
| [A]-2 Example 11 | Polyurethane resin (c) of the present invention | 70,000 |
| [A]-3 Example 12 | Polyurethane resin (e) of the present invention | 65,000 |
| [A]-4 Example 13 | Polyurethane resin (f) of the present invention | 70,000 |
| [A]-5 Example 14 | Polyurethane resin (i) of the present invention | 75,000 |
| [A]-6 Example 15 | Polyurethane resin (j) of the present invention | 70,000 |
| [A]-7 Example 16 | Polyurethane resin (l) of the present invention | 75,000 |
| [A]-8 Example 17 | Polyurethane resin (m) of the present invention | 65,000 |
| [C] Comparative Example | Polymer in comparative Example | 50,000 |

It is apparent from Table 3 that Lithographic plates [A]-1 to [A]-8 produced from the polyurethane resin of the present invention had a printing durability superior to that of Lithographic plate [C] and that larger numbers of the prints could be produced according to the present invention.

What is claimed is:

1. A positive working photosensitive composition comprising, in admixture, an effective sensitizing amount of an o-quinonediazide compound, and a polyurethane resin having a phosphonic acid group or ester group thereof, or a phosphoric acid group or ester group thereof in an amount effective to adhere the composition to a support, wherein said polyurethane resin comprises, as a basic structure, a reaction product of a diisocyanate compound having the following general formula (I) with a diol compound having the following general formula (II) or (IV) and a second diol which differs in structure from those of formulae (II) and (IV):

$$OCN-R_1-NCO; \quad (I)$$

-continued $$HO-R_3-\underset{\underset{Z}{\overset{R_5}{|}}}{\overset{R_2}{\overset{|}{C}}}-R_4-OH; \quad (II)$$

$$HO-R_3-\underset{\underset{Z}{\overset{R_5}{|}}}{\overset{|}{N}}-R_4-OH; \quad (IV)$$

wherein $R_1$ represents a divalent aliphatic or aromatic hydrocarbon group unsubstituted or substituted with an alkyl, aralkyl, aryl, alkoxy or halogeno group and, if necessary, $R_1$ may have another functional group which is inert to the isocyanate group, $R_2$ represents a hydrogen atom, or an alkyl, aralkyl, aryl, alkoxy or aryloxy group which may be unsubstituted or substituted with a cyano or nitro group, a halogen atom selected from F, Cl, Br or I, $-CONH_2$, $-COOR_6$, $-OR_6$, $-NHCONHR_6$, $-NHCOOR_6$, $-NHCOR_6$, $-OCONHR_6$ or $-CONHR_6$, $R_6$ being an alkyl group having 1 to 10 carbon atoms or an aralkyl group having 7 to 15 carbon atoms, $R_3$, $R_4$ and $R_5$ may be the same as or different from each other and each represents a single bond or a divalent aliphatic or aromatic hydrocarbon group which may be unsubstituted or substituted with an alkyl, aralkyl, aryl or alkoxy group or a halogen atom; if necessary, $R_3$, $R_4$ and $R_5$ may contain a functional group which is inert to the isocyanate group; and two or three of $R_2$, $R_3$, $R_4$ and $R_5$ may be joined together to form a ring, Ar represents a trivalent aromatic hydrocarbon group unsubstituted or substituted, and Z represents $$-\underset{\underset{OR_8}{|}}{\overset{\overset{O}{\|}}{P}}-OR_7 \quad \text{or} \quad -O-\underset{\underset{OR_8}{|}}{\overset{\overset{O}{\|}}{P}}-OR_7;$$

wherein $R_7$ and $R_8$ are the same as or different from each other and each represents a hydrogen, sodium or potassium atom or an alkyl or aryl group.

2. The composition of claim 1 wherein said $R_2$ represents an alkyl group having 1 to 8 carbon atoms or an aryl group having 6 to 15 carbon atoms.

3. The composition of claim 1 wherein said $R_3$, $R_4$ or $R_5$ represents an alkylene group having 1 to 20 carbon atoms or an arylene group having 6 to 15 carbon atoms.

4. The composition of claim 3 wherein said $R_3$, $R_4$ or $R_5$ represents an alkylene group having 1 to 8 carbon atoms.

5. The composition of claim 1 wherein said Ar represents an aromatic hydrocarbon group having 6 to 15 carbon atoms.

6. The composition of claim 1 wherein said $R_7$ or $R_8$ represents a hydrogen atom, an alkyl group having 1 to 8 carbon atoms, or an aryl group having 6 to 15 carbon atoms.

7. The composition of claim 1 wherein said diisocyanate compound is selected from the group consisting of 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, hexamethylene diisocyanate, trimethylhexamethylene diisocyanate, lysine diisocyanate, a dimer acid diisocyanate, isophorone diisocyanate, 4,4'-methylene bis(cyclohexyl isocyanate), methylcyclohexane-2,4-(or 2,6)-diisocyanate, 1,3-(isocyanatomethyl) cyclohexane, and a diisocyanate compound of an adduct of 1 mol of 1,3-butylene glycol and 2 mol of tolylene diisocyanate.

8. The composition of claim 1 wherein said polyurethane resin has a carboxyl group.

9. The composition of claim 8 wherein said polyurethane resin comprises, as a basic structure, a reaction product of said diisocyanate compound, with said diol compound together with said second diol compound having the following general formula (X), (XI) or (XII):

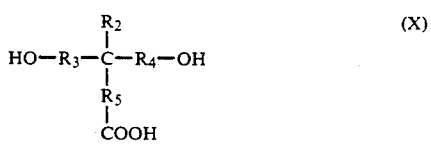 (X)

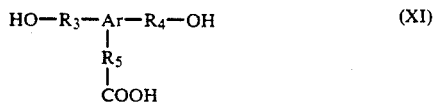 (XI)

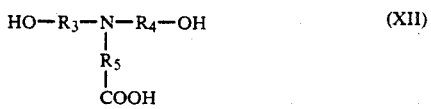 (XII)

wherein $R_2$, $R_3$, $R_4$, $R_5$ and Ar are as defined in general formula (II), (III) or (IV).

10. The composition of claim 9 wherein said diol compound having the general formula (X), (XI) or (XII) is selected from the group consisting of 3,5-dihydroxybenzoic acid, 2,2-bis(hydroxymethyl) propionic acid, 2,2-bis(2-hydroxyethyl)propionic acid, 2,2-bis(3-hydroxypropyl)propionic acid, 2,2-bis(hydroxymethyl)acetic acid, bis(4-hydroxyphenyl)acetic acid, 4,4-bis(4-hydroxyphenyl)pentanoic acid, tartaric acid, N,N-dihydroxyethylglycine and N,N-bis(2-hydroxyethyl)-3-carboxypropionamide.

11. The composition of claim 1 wherein said polyurethane resin is contained in an amount of 30 to 95% by weight based on the total amount of the composition.

12. The composition of claim 11 wherein said polyurethane resin is contained in an amount of 50 to 90% by weight based on the total amount of the composition.

13. The composition of claim 1 wherein said an o-quinonediazide compound is an o-naphthoquinonediazide compound.

14. The composition of claim 13 wherein said o-naphthoquinonediazide compound is a sulfonic acid ester prepared by a chemical condensation of a 1,2-naphthoquinone-2-diazide having a halogeno sulfonyl group at its 4- or 5-position, with a mono- or polyhydroxyphenyl compound.

15. The composition of claim 14 wherein said mono- or polyhydroxyphenyl compound is selected from the group consisting of 4-hydroxybenzophenone, 2,4-dihydroxybenzophenone, 2,2'-dihydroxybenzophenone, 4,4'-dihydroxybenzophenone, 2,3,4trihydroxybenzophenone, 2,4,6,-trihydroxybenzophenone, 2,4,4,'-trihydroxybenzophenone, 2,3,4,4'-tetrahydroxybenzophenone,2,2,',4,4,'-tetrahydroxybenzophenone, 2,3,4,2,'-tetrahydroxybenzophenone, 3,3',4,4'-tetrahydroxybenzophenone, benzophenone compounds having 5 or more hydroxyl groups and their derivatives, p-cresol, p-t-butylphenol, resorcin, pyrogallol, 2,2'-dihydroxybiphenyl, 2,2',4,4'-tetrahydroxybiphenyl, a phenol/formaldehyde resin, o- , m- or p-cresol/formaldehyde resin condensates of a polyhydric phenol with an aldehyde or a ketone, co-condensate of catechol, resorcin or hydroquinone with a substituted phenol produced in the presence of an aldehyde or ketone, condensates or a substituted phenol with benzaldehyde, co-codensates of phenol with o- , m- or p-cresol produced in the presence of an aldehyde or a ketone, and p-hydroxystyrene polymers.

16. A presensitized plate comprising a support having coated thereon the photosensitive composition of claim 1.

* * * * *